(12) United States Patent
Loertscher et al.

(10) Patent No.: US 11,063,167 B2
(45) Date of Patent: Jul. 13, 2021

(54) PHOTOVOLTAIC SYSTEM WITH NON-UNIFORMLY COOLED PHOTOVOLTAIC CELLS

(71) Applicant: International Business Machines Corporation, Armonk, NY (US)

(72) Inventors: Emanuel Loertscher, Bonstetten (CH); Bruno Michel, Zurich (CH); Stephan Paredes, Zurich (CH); Patrick Ruch, Jenins (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 179 days.

(21) Appl. No.: 16/032,266

(22) Filed: Jul. 11, 2018

(65) Prior Publication Data

US 2018/0323326 A1  Nov. 8, 2018

Related U.S. Application Data

(63) Continuation of application No. 15/096,647, filed on Apr. 12, 2016, now Pat. No. 10,050,165.

(51) Int. Cl.
*H01L 31/052* (2014.01)
*H01L 31/054* (2014.01)
*H01L 31/0352* (2006.01)

(52) U.S. Cl.
CPC .. *H01L 31/0521* (2013.01); *H01L 31/035281* (2013.01); *H01L 31/052* (2013.01);
(Continued)

(58) Field of Classification Search
CPC ............. H01L 31/0521; H01L 31/0543; H01L 31/0547; H01L 31/035281
See application file for complete search history.

(56) References Cited

U.S. PATENT DOCUMENTS

| 4,045,246 | A | | 8/1977 | Mlavsky et al. |
| 4,106,952 | A | * | 8/1978 | Kravitz ................... H01L 23/38 |
| | | | | 126/634 |

(Continued)

FOREIGN PATENT DOCUMENTS

| CN | 202217684 U | 5/2012 |
| CN | 102751365 A | 10/2012 |

(Continued)

OTHER PUBLICATIONS

IBM "List of IBM Patents or Patent Applications Treated as Related; (Appendix P)", Filed Jul. 11, 2018, 2 pages.

(Continued)

*Primary Examiner* — Golam Mowla
(74) *Attorney, Agent, or Firm* — Cantor Colburn LLP; Daniel Morris

(57) ABSTRACT

One or more embodiments of the present invention are directed to a photovoltaic system. The system comprises photovoltaic cells, arranged side-by-side to form an array of photovoltaic cells. It further involves a cooling device, which comprises one or more layers, wherein the layers extend opposite to the array of photovoltaic cells and in thermal communication therewith, for cooling the cells, in operation. The one or more layers are structured such that a thermal resistance of the photovoltaic system varies across the array of photovoltaic cells, so as to remove heat from photovoltaic cells of the array with different heat removal rates, in operation. One or more embodiments of the present invention are further directed to related systems and methods for cooling such photovoltaic systems.

7 Claims, 8 Drawing Sheets

(52) U.S. Cl.
CPC ...... *H01L 31/0543* (2014.12); *H01L 31/0547* (2014.12); *Y02E 10/52* (2013.01)

(56) References Cited

U.S. PATENT DOCUMENTS

| | | | |
|---|---|---|---|
| 4,149,903 A * | 4/1979 | Lindmayer | H01L 31/052 126/569 |
| 4,169,738 A | 10/1979 | Luque | |
| 4,211,581 A | 7/1980 | Vasilinina et al. | |
| 4,830,678 A | 5/1989 | Todorof et al. | |
| 4,834,805 A * | 5/1989 | Erbert | G02B 3/0056 136/246 |
| 5,388,635 A | 2/1995 | Gruber et al. | |
| 6,219,236 B1 | 4/2001 | Hirano et al. | |
| 6,531,653 B1 | 3/2003 | Glenn et al. | |
| 8,648,249 B1 | 2/2014 | West | |
| 9,153,722 B2 | 10/2015 | Werner et al. | |
| 2001/0000577 A1 | 5/2001 | Parise | |
| 2005/0211418 A1 | 9/2005 | Kenny et al. | |
| 2007/0289622 A1 | 12/2007 | Hecht | |
| 2010/0000594 A1 | 1/2010 | Zalusky et al. | |
| 2011/0017199 A1 | 1/2011 | Hernandez | |
| 2011/0155214 A1 | 6/2011 | Lam | |
| 2012/0060921 A1 | 3/2012 | Jee | |
| 2012/0305077 A1 | 12/2012 | Arab et al. | |
| 2017/0294549 A1 | 10/2017 | Loertscher et al. | |

FOREIGN PATENT DOCUMENTS

| | | |
|---|---|---|
| CN | 202712233 U | 1/2013 |
| JP | 2012532443 A | 12/2012 |
| JP | 2013008763 A | 1/2013 |
| WO | 2011143516 A2 | 11/2011 |
| WO | 2013144750 A1 | 10/2013 |
| WO | 2014134159 A1 | 9/2014 |

OTHER PUBLICATIONS

"Advanced Dense Array Module (ADAM)" Azur Space Solar Power GmbH, Dec. 2016 (2 pages).

Cotal et al. "Heat transfer modeling of concentrator multijunction solar cell assemblies using finite difference techniques" Spectrolab, Inc. (A Boeing Company), 2010 35th IEEE Photovoltaic Specialists Conference, Jun. 2010 (pp. 213-218).

King "Raising the Efficiency Ceiling in Multijunction Solar Cells" Spectrolab, Inc. (A Boeing Company), Feb. 2011, Retrieved from the Internet (83 pages).

Rosina "High Concentration Photovoltaics: A technology on the way to the utility market—Growing interest for III-V players" Yole Developpement, Oct. 2011 (4 pages).

International Search Report and Written Opinion for International Application No. PCT/IB2017/051552; Application Filing Date Mar. 17, 2017; dated Jul. 6, 2017 (7 pages).

J. Ji et al., "A jet impingement/channel receiver for cooling densely packed photovoltaic cells under a paraboloidal dish solar concentrator," Heat Transfer Research 43(8), 2012, pp. 767-778.

T. Woei Chong, "Study of Automotive Radiator Cooling System for a Dense-Array Concentration Photovoltaic System", Department of Engineering and Scnience, Tunku Abdul, Apr. 2013, p. 1-121.

X. Han, et al., "Thermal Analysis of Direct LiquidImmersedSolar Receiver for High Concentrating Photovoltaic System", International Journal of Photoenergy, vol. 2015, Jul. 27, 205, p. 1-10.

Examination Report for Application No. GB1816539.9; Date of Filing Mar. 17, 2017; dated Jun. 23, 2020 (4 pages).

Bahaidarah "Experimental performance investigation of uniform and non-uniform cooling techniques for photovoltaic systems" 2015 IEEE 42nd Photovoltaic Specialist Conference (PVSC). IEEE, (Jun. 2015) pp. 1-4.

* cited by examiner

PHOTOVOLTAIC SYSTEM WITH NON-UNIFORMLY COOLED PHOTOVOLTAIC CELLS

DOMESTIC AND/OR FOREIGN PRIORITY

This application is a continuation of U.S. application Ser. No. 15/096,647, titled "PHOTOVOLTAIC SYSTEM WITH NON-UNIFORMLY COOLED PHOTOVOLTAIC CELLS" filed on Apr. 12, 2016, the entire contents of which are incorporated herein by reference.

BACKGROUND

The invention relates in general to the field of cooled photovoltaic systems, and more specifically to photovoltaic systems having photovoltaic cells arranged side-by-side to form an array of photovoltaic cells, and further to methods for cooling such photovoltaic systems.

The following definitions are assumed throughout this description.

Photovoltaics (PV) describes the generation of electrical power by converting solar radiation into direct current electricity through semiconductors exhibiting the photovoltaic effect.

A photovoltaic cell (or PV cell, also "solar cell" or "photoelectric cell") is a solid state device that converts energy of light directly into electricity by virtue of the photovoltaic effect.

A photovoltaic array or module (also "solar module", "solar panel" or "photovoltaic panel") is an assembly of connected photovoltaic cells.

A photovoltaic system typically includes at least one module of photovoltaic cells, an inverter and interconnection wiring.

A thermal collector (also "solar thermal collector") collects heat by absorbing radiation, typically solar radiation.

A heat exchanger or heat coupler is a device or a piece of equipment to efficiently transfer heat from one medium to another.

A heat sink is a heat exchanger that serves to cool a device (such as an array of photovoltaic cells) by dissipating heat from the device into another medium.

Concentrated solar power (also "concentrating solar power" or CSP) systems use mirrors or lenses that concentrate radiative flux of a large area onto a small area, such that electrical power (also "power") can be produced when concentrated light is converted to heat, which drives a heat engine (e.g., a steam turbine) connected to a power generator. Common forms of concentration are parabolic trough, dish, concentrating linear Fresnel reflector and solar power tower.

Concentrated photovoltaic (CPV) systems use optics (e.g., lenses) to concentrate a large amount of sunlight onto a small area of photovoltaic materials to generate electricity. Concentration allows for usage of smaller areas of solar cells.

CPV should not to be confused with CSP. In CSP concentrated sunlight is converted to heat, and then heat is converted to electricity. In contrast, in CPV concentrated sunlight is converted directly to electricity using the photovoltaic effect.

Photovoltaic thermal hybrid solar collectors (also "hybrid PV/T systems" or PVT) are systems converting solar radiation into thermal and electrical energy. Such systems combine photovoltaic cells, which converts photons into electricity, with a solar thermal collector, which captures the remaining energy by removing heat from the PV module. Two categories of PVT collectors are generally known, namely, PV/T fluid collectors and PV/T concentrators.

In PV/T fluid collectors (air or liquid), which are typically water-cooled, use is generally made of thermally conductive metal piping or plates attached to the back of a PV module. The working fluid is typically water or a water-glycol mixture. The heat from the PV cells is conducted through the metal and absorbed by the working fluid, which assumes that the working fluid is cooler than the operating temperature of the cells. In closed-loop systems this heat is either rejected to ambient or transferred at a heat exchanger, where it flows to its application for further usage. In open-loop systems, the working fluid is not recirculated to the PV cells following rejection or further usage of heat.

In PV/T concentrators (CPVT), a concentrating system is provided to reduce the amount of solar cells needed. CPVT can reach very good solar thermal yield per unit PV cell area compared to flat PV/T collectors. However, main obstacles to CPVT are to provide sufficient cooling of the solar cells and a durable tracking system.

A disadvantage of PV systems compared to other energy sources is the intermittent nature of the direct solar radiation. This leads to intermittent power delivery, which has much less value than on-demand power and may lead to grid instabilities. Storage of electrical energy in, e.g., batteries is prohibitively expensive so that the cost for a storage unit for a full day production may cost more than the solar power station. Concentrated solar power systems (CSP) can store the collected heat and produce electricity on demand until the stored heat is dissipated. Concentrated photovoltaic (CPV) power plants have higher conversion efficiencies than PV and CSP systems. Still, CPV systems are subject to intermittent power production. In addition, their efficiency depends on the performances of the PV cells composing the array, or module, and of the cooling system used to cool the PV cells. Concentrated photovoltaic thermal (CPVT) systems have a higher system efficiency because of the added usage of heat.

CPV systems aim at achieving high geometrical concentrations of solar irradiance on PV cells, typically in the order of 500-3000 suns. Such concentrations are typically enabled by faceted mirrors, focusing light on one single focal plane. However, the mirror topology is never perfect. The varying focal points and acceptance apertures of the individual mirrors lead to a non-homogenous illumination pattern on the focal plane. Thus, optical mixers may be used, which aim at homogenizing the illumination pattern. This, however, reduces the concentration efficiency. An example of a circular illumination pattern is shown in FIG. 3A. An example of a homogenized illumination pattern is shown in FIG. 4A. Color contour plots are used, and the corresponding 3D plots are shown, in each case.

The concentrating optics used in CPV systems generally result in non-uniform illumination on the PV cell surface. A more uniform illumination would come at a cost of lower efficiency, because more optical elements need be integrated. To reduce cost of packaging and cooling, arrays of PV cells (placed side-by-side) are sometimes designed with a common support structure which provides electrical interconnection and cooling. However, in this configuration the PV cells in the array are exposed to different illumination and therefore exhibit different electrical output characteristics. In order to have the same electrical output for each PV cell, several CPV solutions rely on pairing a single optical element with a single PV cell (point-focus systems).

Compared to point-focus systems, dense array systems use closely packed PV cells, which involve several cells per concentrating element. Such solutions may thus offer a cost advantage. In dense array systems, heat generation may be higher than for point-focus systems because there is less surface area per cell for heat dissipation. With appropriate thermal management, the heat generated in a dense array system can be used for polygeneration (i.e., production of electricity, heat and additional resources like, e.g., potable water or air-conditioning), which results in improved cost-performance of the overall system.

Efficient cooling devices have been designed, such as described in WO 2013/144750 A1, where the cooling device provides a thermal resistance which is very low and uniform over a large area, onto which PV cells can be attached. Such a cooling device provides a means to keep PV cell temperatures below a required threshold and, this, even at high concentrations of solar radiation. Furthermore, due to its low thermal resistance, this cooling device allows the generated heat to be recovered at high temperatures, which further allows exploiting polygeneration.

SUMMARY

According to a first aspect, one or more embodiments of the present invention are embodied as a photovoltaic (PV) system. The system comprises photovoltaic (PV) cells, arranged side-by-side to form an array of PV cells. It further involves a cooling device, which comprises one or more layers, wherein the layers extend opposite to the array of PV cells and in thermal communication therewith, for cooling the cells, in operation. The one or more layers are structured such that a thermal resistance of the PV system varies across the array of PV cells, i.e., in a plane parallel to an average plane of the array, so as to remove heat from PV cells of the array with different heat removal rates, in operation.

The above solution makes it possible to modulate temperatures across the array of PV cells and can therefore be used to lower non-uniformities in the output characteristics of each PV cell at the maximum power point (or MPP), for example the voltage ($V_{MPP}$) and current ($I_{MPP}$). In particular, this property may be exploited to allow the spread on the output voltages (or $V_{MPP}$ spread) to be reduced, and possibly minimized. Reducing the $V_{MPP}$ spread results in increasing the minimum $V_{MPP}$, which is particularly advantageous when cells are connected in parallel. This, in turn, improves the energy efficiency of the system, as discussed below in detail. This present solution can notably be used in dense arrays of PV cells, in CPV, CPVT or hybrid PV/T systems.

In one or more embodiments, the one or more layers are structured to allow for the thermal resistance to vary across the array of PV cells according to a predetermined illumination profile of the PV cells of the array.

In particular, the PV system may be a CPV system, configured to concentrate light onto an area of the array of PV cells, in operation, thereby giving rise to a non-uniform illumination profile of the cells. Thus, the one or more layers may be structured so as for the thermal resistance to vary across the array of PV cells according to the non-uniform illumination profile. The PV cells may be multi-junction PV cells.

In one or more embodiments, the one or more layers are structured so as for the thermal resistance to vary within a range from 0.05 to 0.7 cm² K/W, to best accommodate the various heat removal rates across different cells of the array. For example, the difference in average, local thermal resistances of the system at locations corresponding to two, given PV cells of the array (e.g., cells subject to substantially different illumination in the array) may be larger than 0.1 cm² K/W or, even, larger than 0.2 cm² K/W.

In one or more embodiments, the thermal resistance is designed so as to confine a spread of voltages of the cells at the MPP, as noted above, where a maximal difference in the (individual) MPP voltages of each of the PV cells of the array is less than 0.2 V, in operation. Such a confinement already gives rise to good performances for the system in practice. Yet, performances shall be further improved if the maximal difference is further reduced, e.g., to less than 0.1 V, in operation.

Due to the achievable confinement of the $V_{MPP}$ spread, at least some of the PV cells (if not all) of the array may favorably be electrically connected in parallel.

In one or more embodiments, the cooling device is designed as follows. The one or more layers it comprises may notably include at least one layer that exhibits a non-uniform pattern of orifices or structures, e.g., structures protruding out-of-plane. Namely, the pattern of orifices or structures varies in-plane, i.e., in a plane parallel to an average plane of the array of PV cells. This allows non-uniform heat exchanges (via the orifices or structures) and, in turn, makes it possible to remove heat at distinct PV cells of the array with different heat removal rates.

For example, the at least one layer may exhibit local densities and/or dimensions of orifices or structures that are larger at a location vis-à-vis a center of the array than at one or more locations vis-à-vis respective, outer portions or the array, e.g., in particular when a centric illumination pattern is expected.

In variants, local densities and/or dimensions of orifices or structures may be larger vis-à-vis outer portions or the array, e.g., if a homogenized illumination pattern is involved.

In one or more embodiments, the one or more layers comprise at least two layers that exhibit distinct, non-uniform patterns of orifices. Such orifices are arranged so as to allow fluid communication from one of the two layers to another one of the two layers. In other words, a varying thermal resistance is achieved by patterning two layers, e.g., two contiguous layers of the cooling device, so as to remove heat at distinct PV cells of the array with different heat removal rates, in operation.

If necessary, the cooling device may involve three or more layers, which form a stack of cooling microstructures, and allow thermal communication from any one of the three layers to any other one of the three layers.

For example, the non-uniform pattern of orifices may, in a given layer of the stack, comprise concentric, circular slits, wherein, a gap between the circular slits varies radially in-plane, i.e., in a plane parallel to the average plane of the array. Such a pattern is well suited for a centric illumination pattern.

In variants, a non-uniform pattern of orifices may be achieved due to a one-dimensional (1D) or two-dimensional (2D) array of slits, wherein a gap between the slits varies along a given direction in a plane parallel to the average plane of the array. Such a design is advantageously employed to match homogenized illumination patterns. Yet, a 2D array of slits that exhibits a radially varying gap between the slits may equally be used for centric illumination patterns.

According to another aspect, one or more embodiments of the invention are a method for cooling a PV system, where the latter comprises PV cells arranged side-by-side to form an array of PV cells. The method comprises cooling the PV cells by removing heat from PV cells of the array with different heat removal rates, consistently with principles noted above.

In particular, this may be achieved due to a cooling device as described above, i.e., comprising one or more layers, arranged opposite to the array of PV cells and in thermal communication therewith, wherein the one or more layers are structured such that the PV system has a thermal resistance that varies across the array of PV cells.

For instance, the system may be a CPV system, concentrating light onto an area of the array of PV cells, thereby giving rise to a non-uniform illumination profile of the cells. Accordingly, the step of cooling the PV cells may be performed according to the non-uniform illumination profile.

More generally, cooling the PV cells may be performed according to a predetermined illumination profile of the PV cells of the array.

In one or more embodiments, the cooling step is performed so as to confine a spread of output voltages of each of the cells at the MPP, such that a maximal difference in the individual voltages, at the MPP, of each of the PV cells is less than 0.2 V, and preferably less than 0.1 V. Due to the achievable confinement of the voltage spread, at least some of the PV cells of the array may advantageously be electrically connected in parallel in the array, also for the purpose of performing present methods.

In one or more embodiments, the cooling step relies on circulating a liquid via a non-uniform pattern of orifices of the one or more layers, to allow a non-uniform heat exchange via the orifices and, in turn, to remove heat at distinct PV cells of the array with different heat removal rates. For instance, a liquid may be circulated via distinct, non-uniform patterns of orifices of two, or more, contiguous layers of the one or more layers.

Photovoltaic systems and cooling methods embodying the present invention will now be described, by way of non-limiting examples, and in reference to the accompanying drawings.

BRIEF DESCRIPTION OF THE DRAWINGS

FIG. 3B shows a centric illumination pattern superimposed on a dense array of photovoltaic cells;

FIGS. 3C-3D show top views of two layers of a cooling device that exhibit distinct, non-uniform patterns of orifices, allowing heat to be removed from distinct photovoltaic cells of the array of FIG. 3B with different heat removal rates, as involved in embodiments;

FIG. 4A shows an example of homogenized pattern;

FIG. 4B depicts such a pattern superimposed on a dense array of PV cells;

FIGS. 4C-4D show top views of two layers of a cooling device that exhibit distinct, non-uniform patterns of orifices, suited for removing heat from distinct photovoltaic cells of the array;

FIGS. 8C and D show corresponding thermal resistances and output voltage as obtained across the array.

Figure 1:
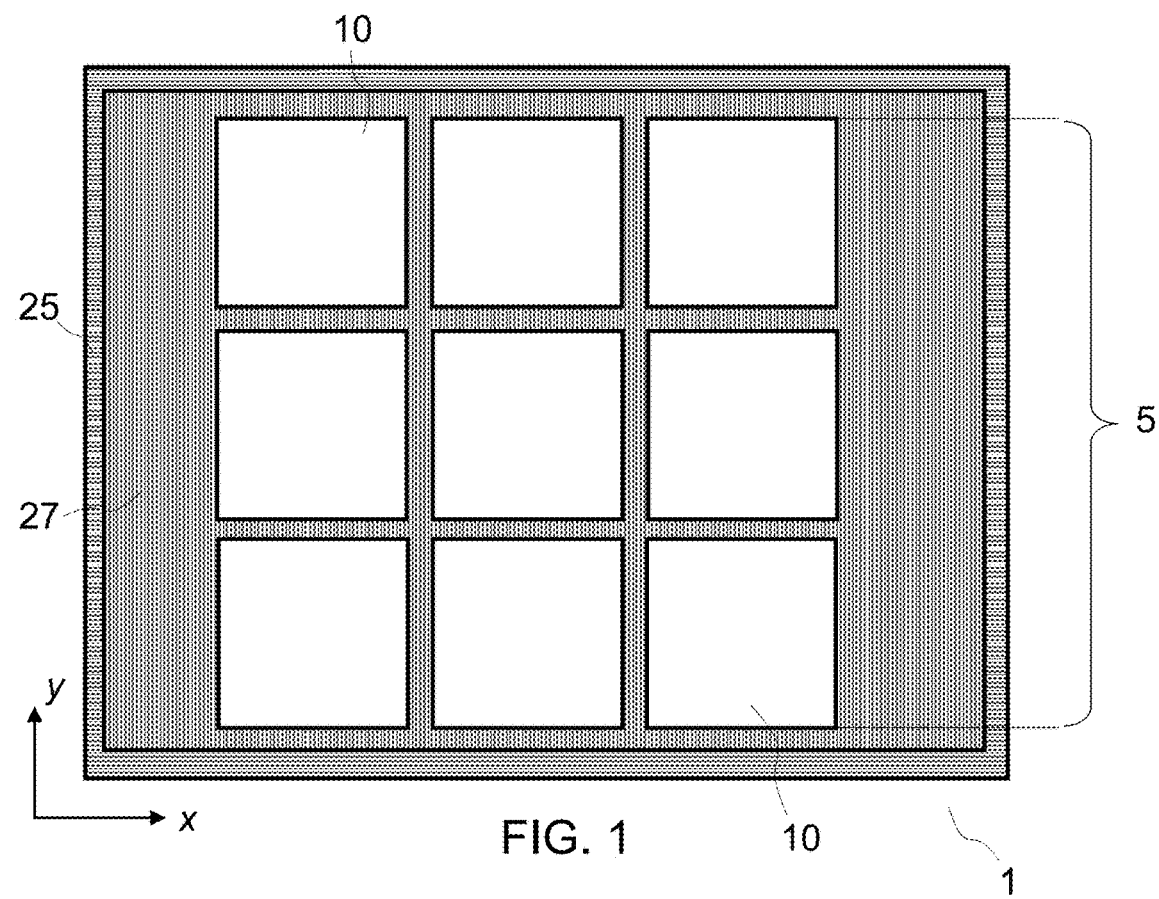
FIG. 1 is a top view of a photovoltaic system, showing an array of photovoltaic cells, according to embodiments.

The accompanying drawings show simplified representations of devices or parts thereof, as involved in embodiments. Technical features depicted in the drawings are not necessarily to scale. Similar or functionally similar elements in the figures have been allocated the same numeral references, unless otherwise indicated.

DETAILED DESCRIPTION

In dense array systems, a plurality of photovoltaic (PV) cells is interconnected electrically in a serial or parallel fashion. It has been determined in accordance with the present teachings that the electrical output of the interconnected array is limited in magnitude due to non-uniformities in the characteristics of each PV cell at the maximum power point (MPP), for example the voltage ($V_{MPP}$) and current ($I_{MPP}$). Furthermore, a non-uniform illumination (as commonly encountered in dense array PV systems) also results in different $V_{MPP}$ and $I_{MPP}$ values, which thus impairs the electrical output of the interconnected array.

Therefore, it has been determined in accordance with the present invention that a modulation of the temperature of the PV cells can be exploited to adjust the output characteristics of the cells (at the MPP), which is especially useful when the cells are interconnected in parallel, e.g., within a dense array of cells. One or more embodiment of the present invention therefore provide a non-uniform cooling approach for PV systems, which makes it possible to modulate temperatures across the PV cell array and, in turn, lower non-uniformities in the output characteristics of each PV cell. This, as one may realize, allows the minimum (individual) MPP voltage of the cells to be increased, which can advantageously be exploited when PV cells are electrically connected in parallel.

Figure 5A:
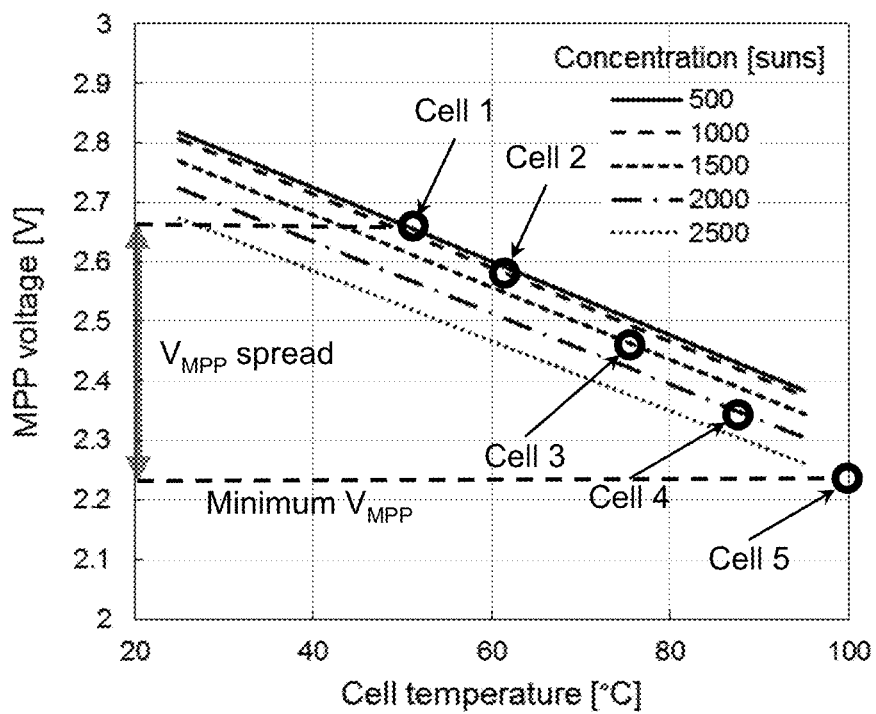
FIG. 5A is a graph representing a voltage spread as typically occurring in uniformly cooled photovoltaic cell arrays (i.e., not according to embodiments), as a function of the temperatures of such cells.
Figure 5B:
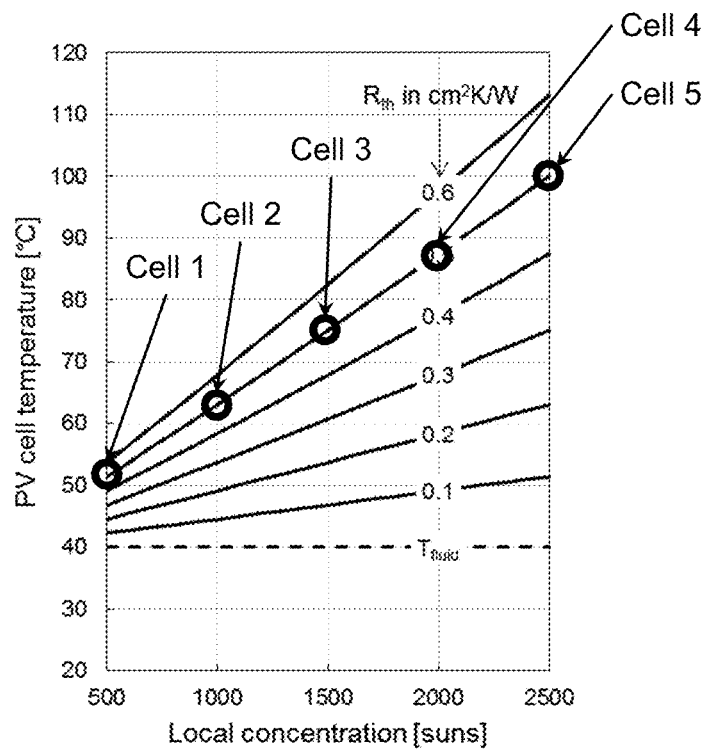
FIG. 5B illustrates the temperature dependence of the cells as a function of the light concentration achieved at the cells, assuming a high, uniform thermal resistance.

In more details, when a typical, prior art cooling solution is used, the PV cells exposed to higher illumination are subject to higher heat flux, which raises their temperature, as reflected in the graph of FIG. 5B. This graph depicts the cell temperature for five given cells of a PV cell array as a function of the light concentration.

Figure 6A:
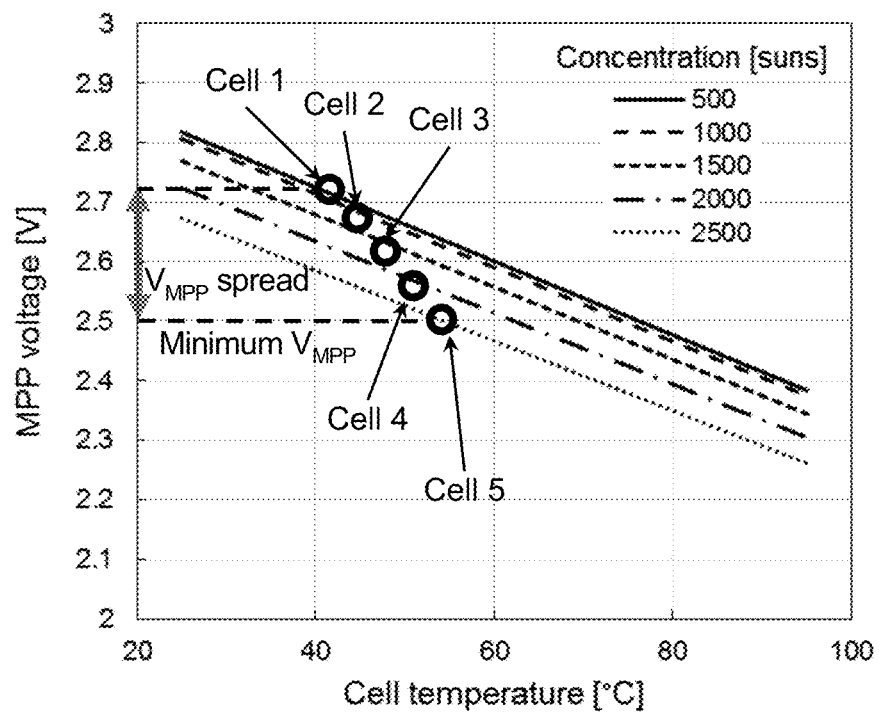
FIGS. 6A and 6B are graphs similar to those of FIGS. 5A and 5B, as obtained with a uniform cooling device (i.e., not according to embodiments), where the system is assumed to have a low, uniform thermal resistance, which results in reducing the voltage spread at the maximum power point.
Figure 6B:
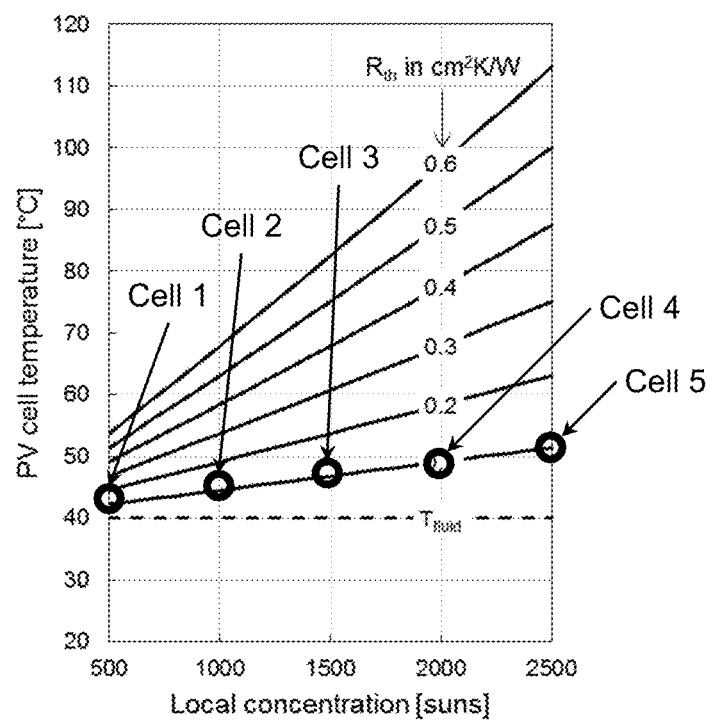
Figure 7A:
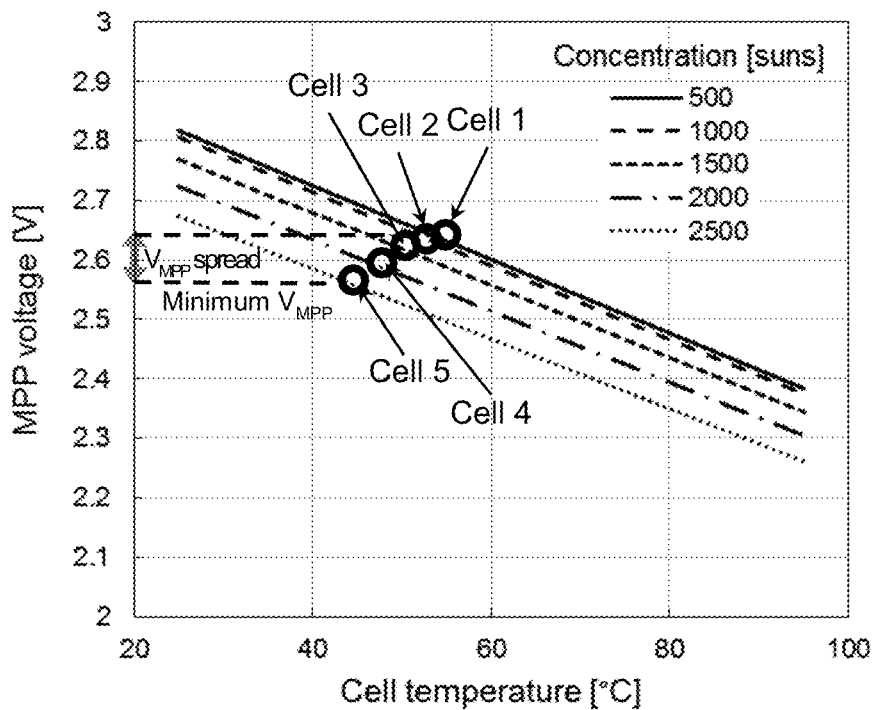
FIGS. 7A and 7B are graphs similar to those of FIGS. 5A-B and 6A-B, and reflecting a non-uniform cooling (according to embodiments), which results in a marked reduction of the voltage spread of each cell under consideration.
Figure 7B:
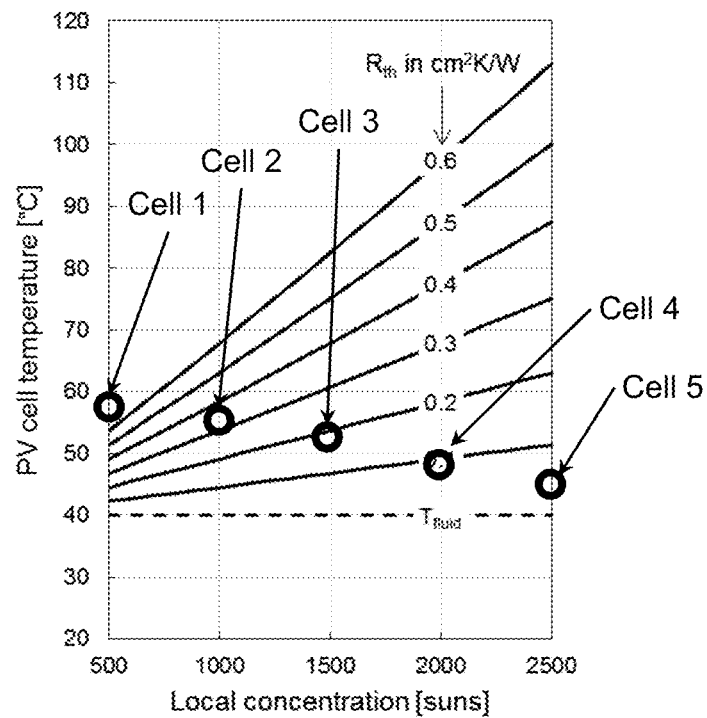

In FIGS. 5B, 6B and 7B, the cells ("Cell 1" to "Cell 5") are each time assumed to be connected to a (different) cooling device and exposed to a same, inhomogeneous illumination. $R_{th}$ denotes the thermal resistance of the whole PV system (including every component on a vertical path, i.e., from the cells to the cooling liquid at the level of the liquid inlet/outlet in the macro stack, see, e.g., FIGS. 1 and 2). The thermal resistance relates the temperature difference ΔT between PV cells and the cooling fluid with the heat flux q on the cells as $\Delta T = R_{th} \dot{q}''$, wherein $\dot{q}''$ denotes the areal density of the time derivative of the heat flux q, i.e., the time derivative of the heat flux q, divided by the surface through which the heat flux passes.

In FIGS. 5A and 5B, which reflect a situation commonly encountered in prior art solutions, the differences in the MPP voltages of the cells are adversely impacted by the non-uniform light concentration and the resulting temperature differences (spanning approximately 50° C. in this example), due to the fact that the PV system exhibits a relatively large, uniform thermal resistance (0.5 cm² K/W in this case, see FIG. 5B).

A cooled system having the lowest possible thermal resistance is reflected in FIGS. 6A-6B, where $R_{th}$ is now uniformly lowered to 0.1 cm² K/W. Logically, the low, uniform thermal resistance results in confining the cell temperatures, which now span an interval of approximately 10° C. (FIG. 6B). This also results in reducing the $V_{MPP}$ spread, as illustrated in FIG. 6A. However, much better results can be obtained with thermal resistances that non-uniformly vary across the cells, as reflected in FIGS. 7A-7B. There, one realizes that adapting the properties of the cooling device, e.g., based on the non-uniform illumination allows the span of MPP voltages to be substantially narrowed, compared to the situations of FIGS. 5 and 6, even though the temperatures of the cells span a larger interval (see FIG. 7B) compared with a situation as in FIG. 6B.

In reference to FIGS. 1-4 and 9, an aspect of the invention according to one or more embodiments is now described, which concerns a PV system 1. Basically, the system 1 comprises PV cells 10, which are arranged side-by-side to form an array 5 of PV cells. The system 1 further comprises a cooling device 20, which involves one or more layers 21-23 (see, e.g., FIG. 2), extending opposite to the array 5 of PV cells 10. The layers 21-23 are in thermal communication with the array 5 of PV cells 10, so as to cool the PV cells 10, in operation.

The layer stack 21-23 is structured such that the thermal resistance of the PV system 1 is not uniform, i.e., it appreciably varies across the array 5 of PV cells 10, i.e., in a plane (x, y) parallel to the average plane of the array 5. The variations of the thermal resistance make it possible to remove heat from PV cells 10 of the array 5 with different heat removal rates for the cells, in operation.

As explained earlier, this makes it possible to modulate the temperatures of the cells across the array of PV cells. A suitable modulation can therefore be achieved, which lowers non-uniformities in the output characteristics ($V_{MPP}$, $I_{MPP}$) of each PV cell at the MPP and, accordingly, lowers (or even minimizes) the $V_{MPP}$ spread of the cells. As it can further be realized, reducing the $V_{MPP}$ spread while maintaining a similar or higher $R_{th}$ makes it further possible to improve the overall energy efficiency of the system 1.

In addition, because the $V_{MPP}$ spread can be (possibly strongly) reduced, the cells 10 can favorably be connected in parallel (at least some of them), without adversely impacting the output of all cells 10.

Figure 2:
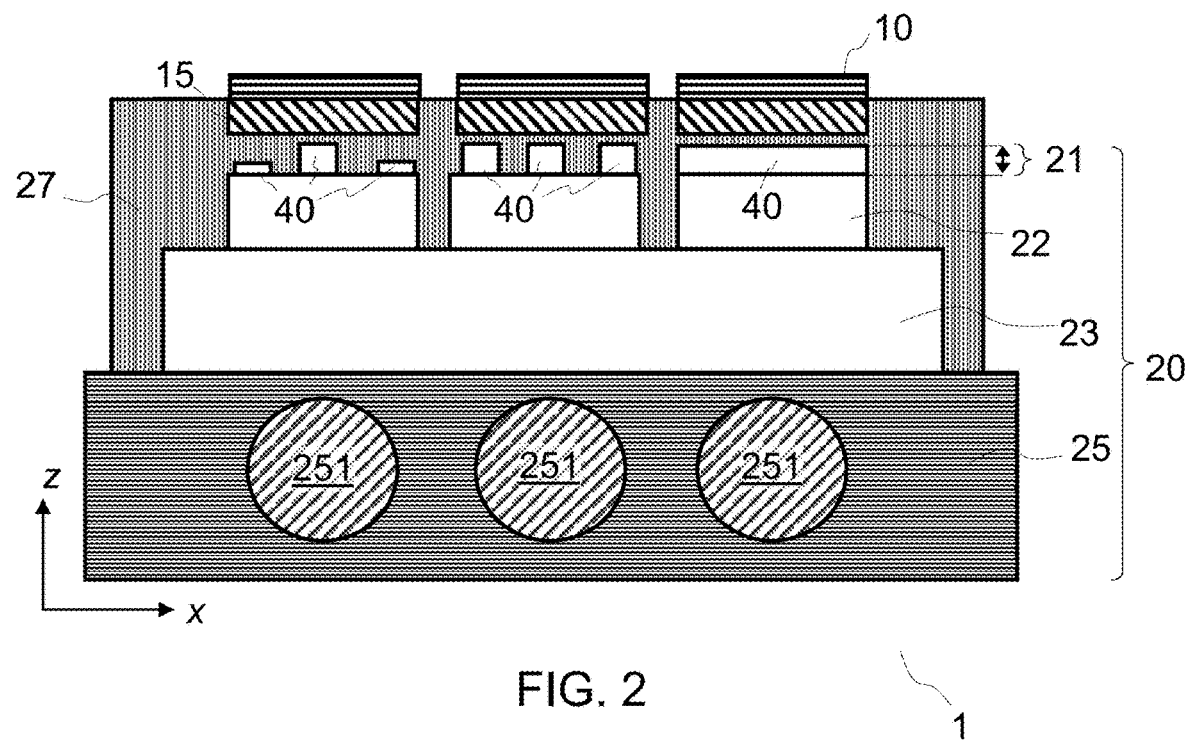
FIG. 2 is a 2D cross-sectional view of the system of FIG. 1, further showing a cooling device that comprises non-uniformly arranged structures, located below the array of photovoltaic cells and in thermal communication therewith, according to embodiments.

The upper side of the cooling device 20 typically spans a surface corresponding to a backside of the array 5, i.e., the non-illuminated side of the cells 10, as in FIG. 2. The cooling device 20 may notably include one or more layers 21-23 (i.e., stacked, planar structures) that exhibit a non-uniform pattern of orifices or slits 31, 32 (or protruding structures 40). A non-uniform pattern means that orifices/structures are non-uniformly dimensioned and or arranged (e.g., distributed, spaced from each other), e.g., in a plane parallel to the planar array 5 and/or perpendicularly to that plane, as illustrated later. In other words, the pattern changes (e.g., non-repeatedly) across the cells, so as to vary the thermal resistance of the system 1 across the array 5 of PV cells 10. The thermal resistance considered here is that of the whole PV system 1. However, the variations of the thermal resistance are essentially conferred by the cooling device 20.

A "layer" 21, 22, 23 of the cooling device typically corresponds to a planar element, which can be structured, machined, etc., so as to achieve the desired non-uniform pattern. A given "layer" 21, 22, 23 may for instance correspond to given level in a hierarchy of a hierarchical cooling stack. Only one of the layers 21-23 of the stack (e.g., the layer on top, which is the closest to the PV cells 10) may exhibit a non-uniform pattern of orifices or structures. However, when using orifices (or slits) to channel a cooling liquid throughout the cooling device 20, a non-uniform pattern in one layer 21 will likely require a non-uniform pattern in the contiguous layer 22, so as to suitably channel the cooling liquid from one layer 22 to the other 21, as discussed latter in reference to FIGS. 3 and 4.

Advantageously, the thermal resistance may be varied across the cells 10 so as to be decreased at certain, specific locations (and conversely be increased at other, specific locations), based on the expected spatial illumination profile of the PV cells 10 of the array 5. Thus, and as reflected in the embodiments of FIGS. 2-4 and 9, one or more layers 21-23 of the PV system 1 may be structured so as for the thermal resistance to vary across the array of PV cells according to a predetermined illumination profile. This makes it possible to achieve a specific temperature modulation which minimizes the $V_{MPP}$ spread and increases the minimum $V_{MPP}$.

As a person skilled in the relevant art may appreciate, intentionally implementing higher thermal resistance values at some locations in the array 5 is counter-intuitive, inasmuch as it is common practice, e.g., in CPV systems, to try to evenly maintain low temperatures across the PV cells to increase their electrical efficiencies.

Overall, the proposed system 1 can be more energy efficient compared to a PV system with a uniform, low thermal resistance, due to better electrical matching of PV cells and the possibility to reduce the overall cooling flow rate and pumping power. Note that an improved electrical matching does not directly allow to reduce pumping power. Rather, by allowing areas with high $R_{th}$, the total pumping can be reduced with respect to the situation where the entire area needs to exhibit a low $R_{th}$.

In order to modulate temperature over a large number of cells (e.g., at least 3×3 cells, 5×5 or, even, 6×6 cells), specific, active cooling schemes can advantageously be used, as discussed below in reference to one or more embodiments.

The power spent in operating the cooling device 20 may be reduced, compared with uniform cooling systems (and at an equal or better total performance of the PV cells), because the average pumping power may be decreased. Indeed, in state-of-the-art cooling devices, the rate of heat removal is uniform and is typically provisioned to satisfy the cooling demand of a target PV cell, i.e., the cell that is subject to the highest heat rate. As a result, the rate of heat removal tends to be overprovisioned for PV cells which are subjected to lower heat rates. PV cells subject to overprovisioning will have a lower cell temperature compared to the aforementioned target PV cell, but their power outputs will likely be much less than that of the target PV cell. Therefore, the overall $V_{MPP}$ (resulting from the combination of the cells) will be much lower than the highest, individual $V_{MPP}$ value (corresponding to that of the target PV cell), despite the high rate of (uniform) heat removal.

In contrast, in the present approach, the rate of heat removal is spatially modulated, e.g., by channeling a liquid flow to act mostly on a target PV cell, in which case the local rate of heat removal is higher for that target PV cell and lower for other PV cells in comparison with the aforementioned example. Therefore, the overall flow rate can be lowered to the extent that the rate of heat removal is identical or slightly higher for a target PV cell, but is decreased for the (many) other PV cells. Thus, the combined $V_{MPP}$ (assuming a parallel connection of the PV cells) will be at least equal to (or better than) that in the above example, but the overall cooling liquid flow rate can be reduced and therefore less pumping power is required in that case.

In addition, the process control required to manufacture present cooling devices 20 is less challenging compared to a uniform cooling devices, because high cooling rates are required over a smaller area (all things being equal).

The present solutions may find applications in electricity generation from solar irradiation and may lead to higher overall energy efficiencies (typically increased relatively by more than 60% compared to conventional PV systems, at module level). Present solutions can notably be contemplated for use in dense arrays of PV cells, in CPV, CPVT or hybrid PV/T systems.

In one or more embodiments, the cooling device 20 is a liquid-based cooling system, comprising one or more layers 21-23, extending opposite to the array 5 of PV cells, wherein liquid can be circulated to remove heat from the array of PV cells, as assumed in the embodiments of FIGS. 3 and 9.

In variants, the cooling device may be a heat sink ensuring heat removal essentially by heat diffusion through heat conducting structures, and possibly convection through fluid flow within the heat sink.

Hybrid solutions can be contemplated, where layers of the device 20 are non-uniformly structured, to vary the thermal resistance across cells, while other layers of the devices convey cooling liquid to evacuate the heat, as assumed in FIG. 2.

All such variants are discussed below in detail.

The cooling device 20 may comprise heat coupling structures 15, in addition to layers 21-23. The cooling devices 15 may, in variants, comprises layers 21-23 that extend up to a boundary of PV cells 10, or to a vicinity thereof, for example if the PV cells are embedded in a thermally conducting substrate (acting as part of a heat exchanger). Thus, heat coupling structures 15 are not strictly needed.

The heat coupling features 15 may be part of the PV cell array 5, or an upper structure containing the latter. Components of the PV cell array and the cooling device may be intermingled. Still, it remains that, in general, the cooling device and the PV array are distinct components, inasmuch as they are typically fabricated independently, before being assembled.

Importantly, it noted that, in the present solutions, the (local) thermal resistances of the system 1 vary from one cell to another, in a measurable way. Such variations should be distinguished from local variations as arising from a uniform pattern of orifices, channels or slits for heat exchange, as known in the art, where the thermal resistance varies at a sub-cell level (e.g., according to a regular lattice, whose step or pitch is substantially smaller than a typical cell dimension), to ensure uniform heat removal. The distinction matters, because one already observes heat removal rate variations (in-plane) in standard, prior art designs, which variations simply arise due to the alignment of the channels, orifices or slits. However, such variations are not suited to compensate for discrepancies among cells, e.g., for non-uniformities in the illumination profile or actual heat rates experienced by the PV cells.

Figure 9A:
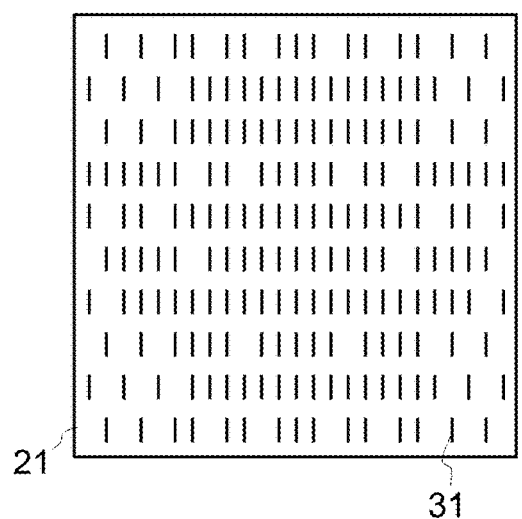
FIG. 9A-D similarly illustrate results obtained by non-uniformly cooling a dense array (FIG. 9B) of photovoltaic cells subject to a same centric illumination as in FIG. 8B, and using a cooling device (FIG. 9A) having a non-uniform pattern of orifices (according to embodiments).
Figure 9B:
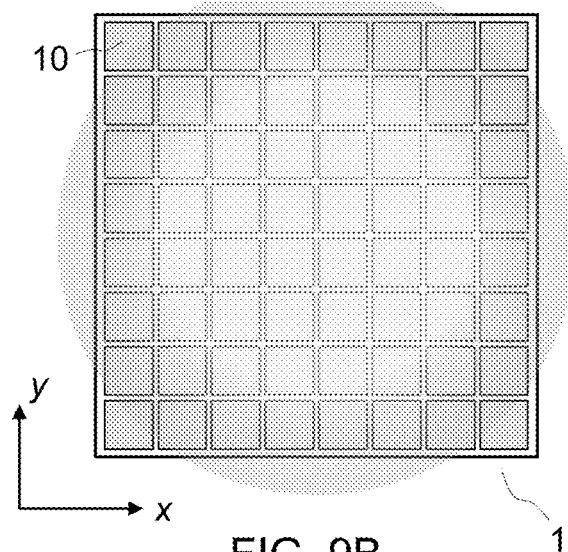
Figure 9C:
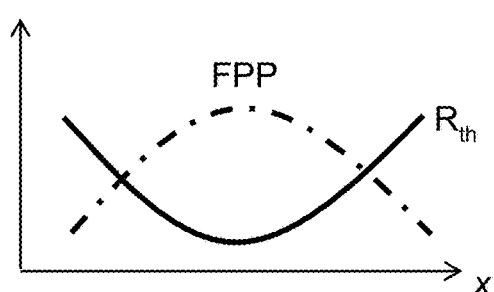

Referring now to FIG. 9A-C, the system 1 may, in embodiments, comprise one or more layers 21-23 that are structured such that the (vertical) thermal resistance to vary within a range from 0.05 to 0.7 cm² K/W. Such values take into account the heat coupling layers 15. More generally, the estimation of the thermal resistance takes all components into account on the vertical path from the surface of the PV cell to the inside of the liquid inlets/outlets (including the cooling liquid itself), e.g., the liquid channels 251 in FIG. 2. Thus, the thermal resistance considered here is the resistance of the whole system 1, even if variations of the thermal resistance across the cells 10 are essentially due to the design of the cooling device 20.

In one or more embodiments, the difference in average, local thermal resistances of the system 1 at locations corresponding to two, given PV cells 10 (not necessarily contiguous) of the array 5, is larger than 0.1 cm² K/W or, even, larger than 0.2 cm² K/W. The two cells at stake may for instance correspond to cells subject to extreme values of illumination. Larger differences of thermal resistances may occur, as illustrated in FIG. 7B (e.g., larger than 0.3 or, even, 0.4 cm² K/W). It is noted that the temperatures of the cells in FIG. 7B correspond to the temperatures in FIG. 7A. The characteristic differences in the local thermal resistances will actually depend on the actual implementation design, the illumination profile that one seeks to compensate for, the materials chosen, their dimensions, the liquid flow rates, and a number of other experimental parameters. The lower bound (0.1 cm² K/W) mentioned above merely reflects a reasonable order of magnitude for the minimal desired value, and for two given cells of the array. Note, however, that not all PV cells need necessarily have distinct heat removal rates. Also small differences (or no difference at all) may occur, depending on the illumination pattern, especially for contiguous PV cells, for which the differences in thermal resistances may be well under 0.1 cm² K/W.

Referring now to FIG. 7A, the thermal resistance of the system 1 may, in one or more embodiments, be designed such that the spread of (individual) output voltages of the cells 10 at the MPP is confined. In particular, and as assumed in FIG. 7A, the maximal difference in the output voltages (at the MPP) of each of the PV cells 10 of the array 5 may advantageously be less than 0.2 V, or even less than 0.1 V, in operation. This difference is ideally as small as possible. In other words, the rate at which heat is removed from a PV element 10 at a specific location of the array 5 is adapted at each location 10 in order to reduce, as possible, the largest difference in the maximum power point of all PV elements 10.

It is noted that, here, one speaks of minimizing the spread of $V_{MPP}$ of cells considered individually, which need be distinguished from the combined $V_{MPP}$ of the cells, when the latter are connected in the array (e.g., in parallel). Indeed, because the maximal difference in the individual output voltages can be substantially reduced, one understands that at least some of the PV cells 10 (or possibly all the cells) may favorably be electrically connected in a parallel fashion, in the array 5.

Figure 3A:
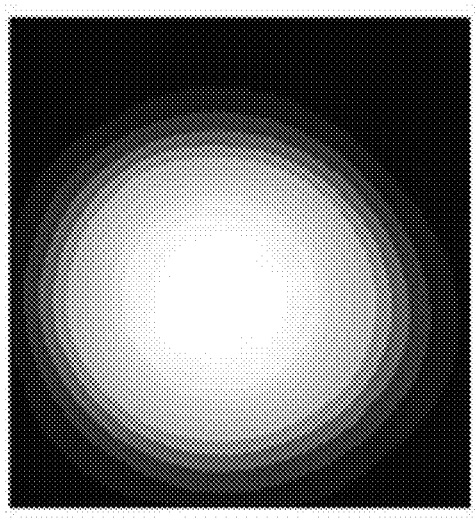
FIGS. 3A-3D are directed to embodiments suited for centric illumination patterns (FIG. 3A)
Figure 3A:
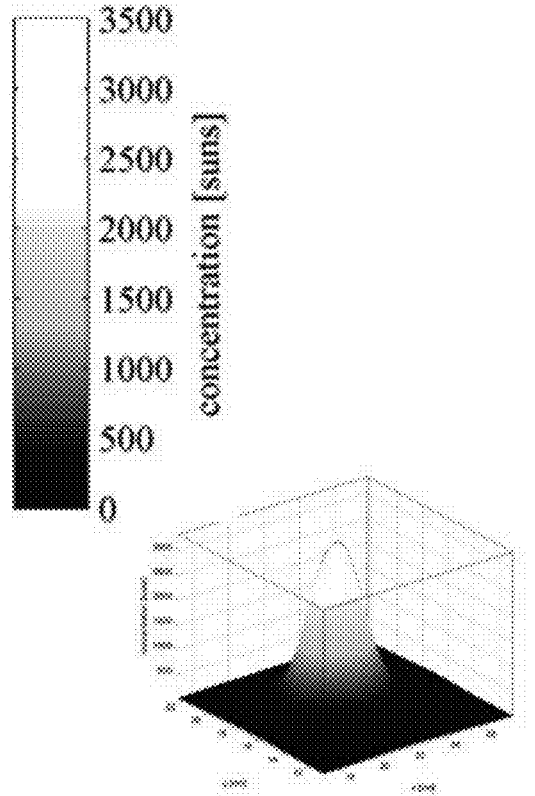
Figure 4A:
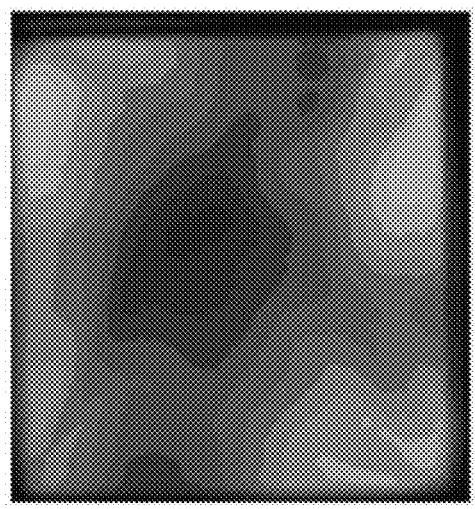
FIGS. 4A-4D depict embodiments suited for a non-centric illumination patterns.
Figure 4A:
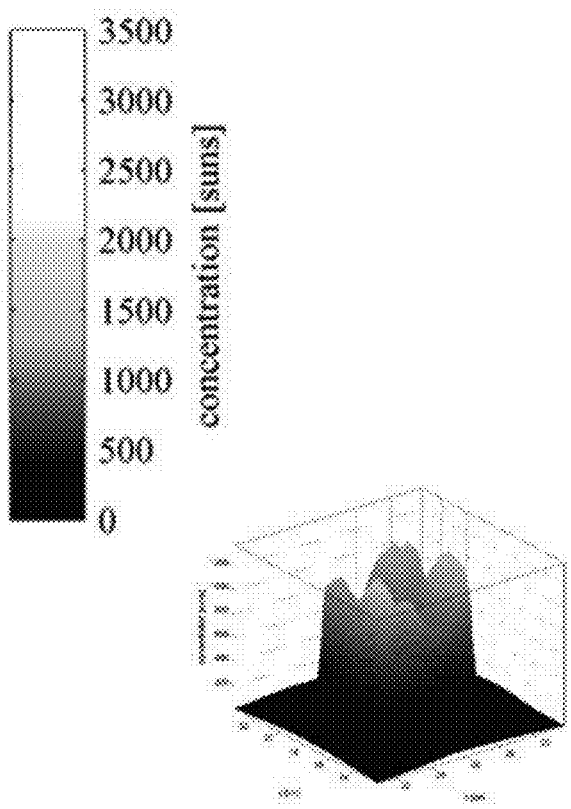
Figure 3B:
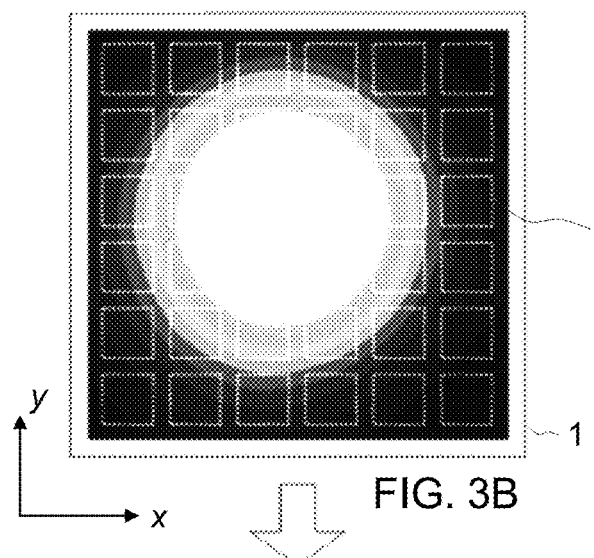
Figure 4B:
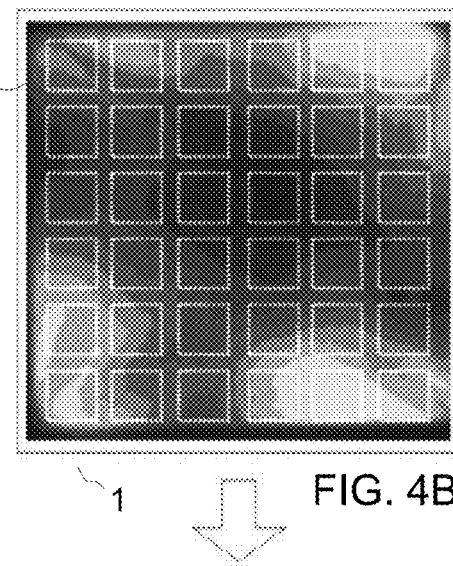

As noted earlier, the thermal resistance of the system may vary according to a predetermined, non-uniform illumination profile, to compensate for the non-uniformity of this profile. This is especially advantageous for CPV systems, or similar systems, as discussed now in reference to FIGS. 3 and 9. CPV systems and the like include optical elements, e.g., lenses, to concentrate a large amount of sunlight onto a small area of the array 5 of PV cells 10, thereby giving rise to a non-uniform illumination profile of the cells 10, typically a centric, radial profile such as depicted in FIGS. 3A and 9B. In such a case, one or more layers 21-23 of the cooling device 20 may advantageously be structured (see, e.g., FIGS. 3C, 3D and 9A) so as for the thermal resistance $R_{th}$ to vary in-plane (i.e., across the array of PV cells, parallel to the average plane of the array 5), and in correspondence with the non-uniform illumination profile resulting from the concentrated light.

The cells 10 may be multi-junction (MJ) PV cells 10. Multi-junction cells have multiple p-n junctions, involving different semiconductor materials. Each semiconductor's p-n junction produces electric current in response to different wavelengths of light. Using multiple semiconductor materials allows absorbance of a broader range of wavelengths, which improves the cell's energy conversion efficiency.

Usual crystalline Si solar cells have PV efficiencies that, in the best cases, are between 20% and 25% (their maximal, theoretical efficiency is of about 34%), while MJ cells have demonstrated PV efficiencies over 43%.

Thus, the system 1 (in particular a CPV system) may, in one or more embodiments, advantageously use MJ cells to better utilize the solar spectrum compared to single junction PV cells such as Si-based cells. The higher cell cost of a MJ cell can be offset by using concentrating optics to reduce the cell area.

As noted earlier, the thermal resistance may be varied by structuring the layers 21-23. In particular, and as illustrated in FIGS. 2, 3C-4D, and 9A, the structure 21-23 may comprise at least one layer (e.g., 21, 22) that exhibits a non-uniform pattern of orifices 31, 32 or structures 40, so as to allow a non-uniform heat exchange via the orifices 31, 32 or structures 40. This, in turn, allows heat to be remove from distinct PV cells of the array 5 with different heat removal rates.

A non-uniform pattern of features such as provided by orifices 31, 32, channels (e.g., slits), or structures 40, implies that the dimensions of such features 31, 32, 40 (in-plane and/or out-of-plane) and/or in-plane gaps between such features 31, 32, 40 vary from one cell to the other in the array 5, so as to remove heat from such cells with different removal rates. Note that a same pattern of features 31, 32, 40 may nevertheless locally occur for several cells. That is, there is no need to have strictly distinct patterns of features for each of the cells, because subsets of cells may be subject to a same heat rate, which simplifies the overall pattern. Yet, at least two (but likely more) PV cells will face distinct, local patterns of structured features 31, 32, 40 in one or more layers 21, 22, 23 of the cooling device 20, as illustrated in FIGS. 2-4 and 9.

Figure 3C:
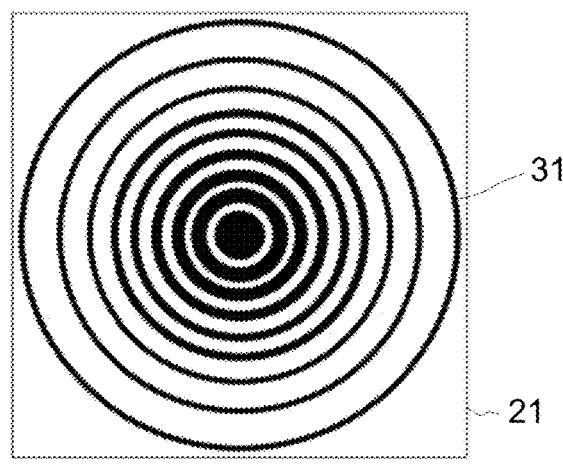
Figure 3D:
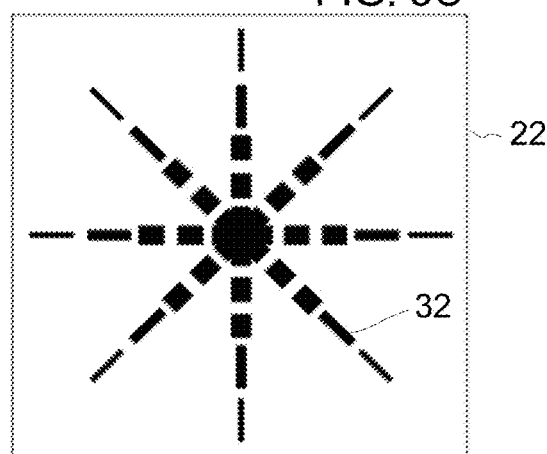

For instance, in FIGS. 3C, 3D, 4C, 4D and 9A, the areal density of orifices 31, 32 provided varies from one cell to the other, in one or more layers 21, 22 of the cooling device, across a surface (x, y) opposite to the array 5 of cells. In FIGS. 3C-D and 9A, the density of cooling slits 31, 32 is larger at the center, consistently with the centric, radial profile expected in such cases.

Figure 9D:
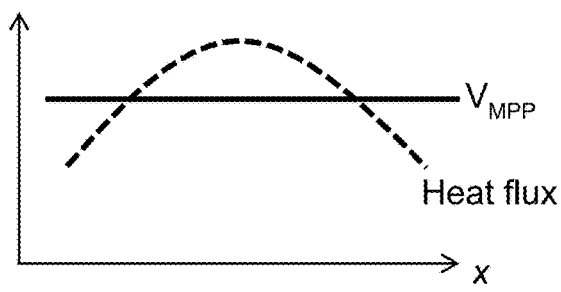

More generally, the density of cooling features may vary, so as for the thermal resistance $R_{th}$ to vary (approximately) inversely with the heat flux experienced by the cells (compare for instance FIGS. 9C and 9D). Ideally, the compensation is adjusted to result in uniform electric properties in output of each cell, as illustrated by the flat $V_{MPP}$ profile of individual cells as obtained in FIG. 9D.

Figure 8A:
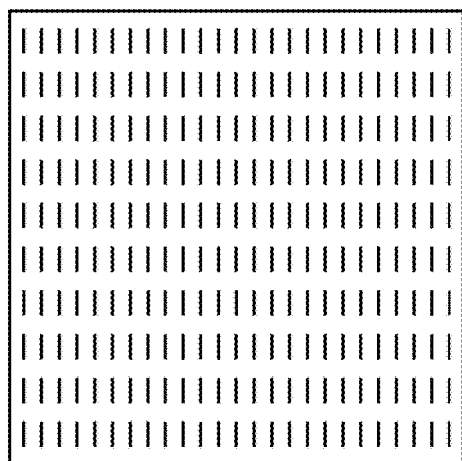
FIG. 8A-D illustrate results obtained by uniformly cooling a dense array (FIG. 8B) of photovoltaic cells subject to centric illumination, using a cooling device (FIG. 8A) with a uniform pattern of orifices for heat removal (not according to embodiments)
Figure 8B:
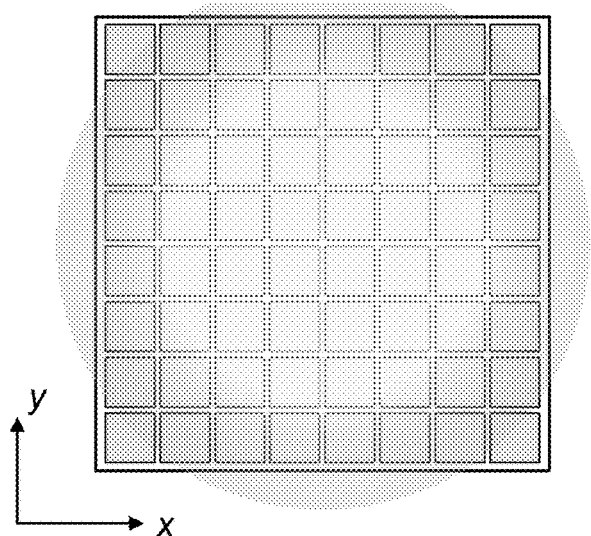
Figure 8C:
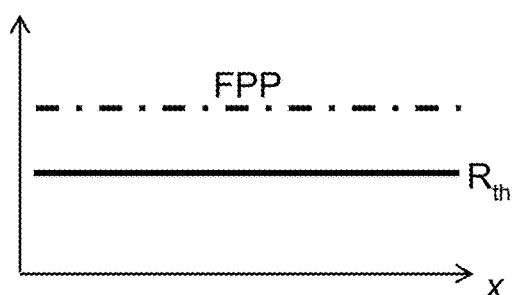
Figure 8D:
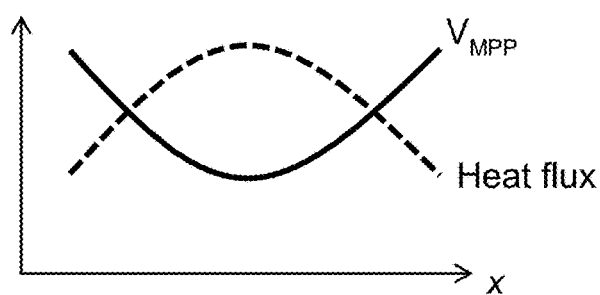

In liquid-based cooling devices, where the density of features 31, 32 is varied, the fractional pumping power FPP (FIG. 9C) can be adjusted to match the heat flux profile (FIG. 9D), which may result in a reduced average pumping power, compared to a situation as in FIGS. 8A-8B (not according to the invention), where the density of cooling features is uniform and the FPP and $R_{th}$ profiles are flat. In FIG. 8A, a (uniform) value of $R_{th}$=0.3 cm$^2$ K/W is assumed, consistently with the typical values obtained with prior art, copper-based heat sinks. As further depicted in FIG. 8D, the resulting $V_{MPP}$ profile of the cells varies substantially, leading to lower performances compared with the embodiment of FIG. 9A, all things otherwise equal.

When a centric illumination profile is expected (as with CPV systems), at least one layer of the stack 21-23 may exhibit local densities and/or dimensions of orifices 31, 32 (FIGS. 3 and 9) or structures 40 (FIG. 2) that are larger at a location vis-à-vis a center of the PV cell array 5 (or any location corresponding to the maximum of the illumination profile) than at one or more locations vis-à-vis respective, outer portions or the array 5, as illustrated in FIGS. 3C, 3D and 9A.

In variants, e.g., when homogenized illumination profiles are expected (as in FIGS. 4A-D), one or more layers of the stack 21-23 may exhibit a higher density of orifices 31, 32 or structures 40, and/or larger dimensions of such features 31, 32, 40 vis-à-vis outer portions or the array 5.

Figure 4C:
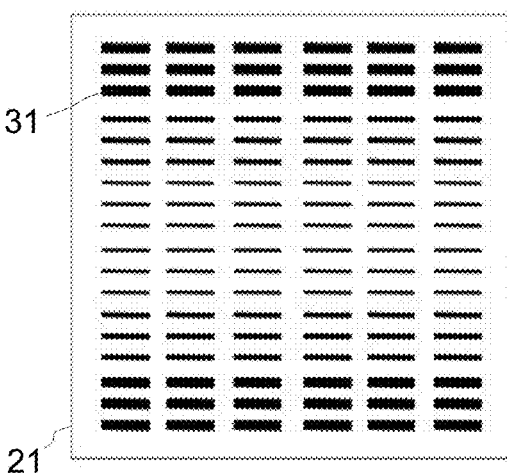
Figure 4D:
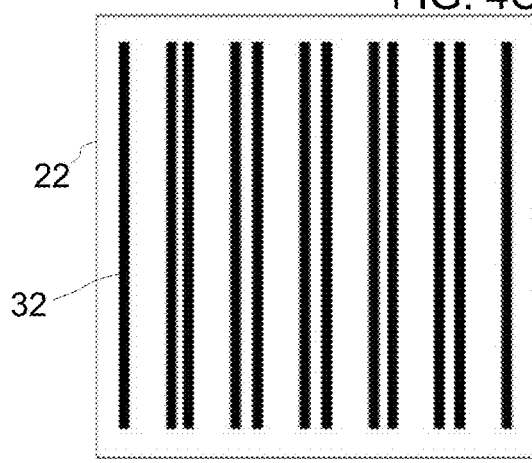

As noted earlier, the thermal resistance can be varied by varying the in-plane dimensions of the features 31, 32, as in FIGS. 3C and 3D, and/or the in-plane gaps between such features, as in FIGS. 4C and 4D, or even the out-of-plane dimensions of protruding structures 40 that make up layer 21, in the example of FIG. 2. Different combinations can be contemplated. For example, in FIG. 2, both the spatial (in-plane) distribution and the out-of-plane dimensions of the features 40 vary from one cell 10 to the other, so as to suitably compensate for non-uniformities of the expected illumination profile.

In addition, one observes that a non-uniform pattern in one layer (say layer 21) may require a non-uniform patter in a contiguous layer 22, to ensure proper liquid channeling from one layer 22 to the other 21, as illustrated in FIGS. 3C and 3D (centric illumination profile) and in FIGS. 4C and 4D (homogenized illumination profile).

In the example of FIGS. 3C-3D, the orifices 31, 32 (in respective layers 21, 22) form a non-uniform, radial pattern, consistently with the expected illumination profile. In particular, layer 21 comprises concentric, circular slits, wherein, a gap between the circular slits varies radially, in-plane with layer 21, that is, the gap is modulated in a plane (x, y) parallel to the average plane of the array 5. I.e., the density of cooling features varies radially on the surface of layer 21, as in FIG. 9A, where the areal density of vertical slits is reduced at the edges, compared to the center.

In the example of FIGS. 4C-4D, the orifices 31, 32 form a 1D array (FIG. 4D) or a 2D array (FIG. 4C) of slits, wherein a gap between the slits varies along a given direction (x or y), in-plane with layer 22.

In each of the embodiments of FIGS. 3C-3D and FIGS. 4C-4D, the cooling pattern is adapted to the illumination pattern and/or the desired operating temperature of the specific PV cells. The cooling channel orientations and dimensions, the liquid flow rates, and the thermal couplings are controlled by design of the cooling device 20, due to the hierarchical arrangement of levels 21-23, and according to a given cooling structure hierarchy. The slits are though-holes, allowing fluid communication from one layer 21 to the other 22. For instance, in layer 22, the orifices 32 are arranged consistently with the slits 31 of the upper layer 21, to ensure proper liquid distribution. Additional slits/channels may be provided in a next layer below layer 22 (not shown), to ensure suitable liquid channeling. Additional structures need be provided to confine the liquid on top of layer 21 (not shown). In variants, the slits 31 in layer 21 may be blind slits, closed on top, such that liquid circulation is bounded by layer 21.

More generally, a PV system 1 according to embodiments may comprise two (or more) layers 21, 22 that exhibit distinct, non-uniform patterns of orifices 31, 32, arranged so as to allow fluid communication from one of the two layers to another one of the two layers and, in turn, remove heat at distinct PV cells 10 of the array 5 with different heat removal rates. This way, liquid may be circulated throughout the layer stack 21-23 to ensure non-uniform heat removals across the cells, as in the embodiments of FIGS. 3, 4 and 9.

Additional, useful information may be found in in WO 2013/144750 A1, concerning possible arrangements and interconnections of the orifices (or channels). Of course, the teaching of in WO 2013/144750 A1 need be suitably adapted to account for the non-uniform patterns as needed in the present context.

For example, the cooling device 20 may involve two fluid circuits (with respective inlet and outlet). Each of these circuits may comprise a specific arrangement of orifices and channel portions, wherein channel portions subdivide into sets of rotated channel portions, etc., according to a self-similar pattern, as described in WO 2013/144750 A1. The in-plane dimensions of and/or gaps between such orifices and channel portions may be adapted to give rise to non-uniform patterns, so as to suitably vary the thermal resistance of the system 1 across the array 5 of PV cells 10.

For instance, the arrangement of orifices and channel portions can form a tree structure, whose branches represent orifices and nodes represent the channel portions. Each circuit further extends through L levels of the tree structure L≥3, and is in fluidic connection with the other circuit, via leaf channel portions, i.e., corresponding to leaf nodes of the tree. For each circuit, channel portions corresponding to sibling nodes are parallel to each other and are furthermore not parallel to a channel portion corresponding to a parent node of the sibling nodes. Finally, channel portions of one fluid circuit may be parallel to and interdigitated with channel portions of the other circuit. More details shall be found in WO 2013/144750 A1.

A structure such as described above allows for achieving a dense and (once suitably adapted to the present context) non-uniform arrangement of orifices at the level of the PV cells or a substrate embedding the PV cells, or at the level of a heat exchanger 15, or heat coupling structure, that is in direct thermal contact with the PV cells.

In simpler (though not as efficient) variants, simple heat-conducting structures 40 may be relied upon, as in the embodiment of FIG. 2, wherein heat is eventually removed due to a simpler liquid circulation.

In the embodiment of FIG. 2, the three layers 21, 22, 23 form a hierarchical stack of cooling microstructures, allowing thermal communication from any one of the three layers to any other one of the three layers. The cells 10 are embedded in a substrate (or body) 27. The hierarchically ordered cooling microstructure stack 21-23 is embedded in the body 27, which is itself supported by another body 25. Liquid conduits 251 are integrated in the supporting body 25, for heat removal, thereby forming a cooling macrostructure stack. Thus, the embodiment of FIG. 2 can be regarded as a hybrid heat-sink/liquid-based cooling solution.

Thermal couplers (or heat exchangers) 15 are located underneath the cells 10; the thermal couplers 15 are furthermore in contact with the PV cell substrate.

The hierarchical cooling stack 21-23 is composed of L≥3 different levels of cooling structures where the first level 21 is in close thermal contact with the thermal couplers 15. The last level 23 is connected to the macrostructure stack 25. The illuminated area is assumed to cover substantially all the PV cell array 5, whose lateral dimensions essentially match those of the bodies 25 and 27. Obviously, the number of cells is limited in this example, for the sake of clarity of depiction. Similarly, the various components depicted are not to scale.

Real devices will likely contain more cells, typically arranged in a 3×3, 4×4, 5×5 or 6×6 array. Larger arrays are also possible. A typical edge length of an individual cell in the (x, y) plane is between 5 mm and 20 mm, and the distance between the edges of contiguous cells may range between 50 μm and 300 μm. The PV cells may be, as mentioned above, of the MJ type, including for example those comprising Ge, InGaAs, and InGaP. The cells are typically joined to the body 27 via an intermediary electrically conductive layer (not shown) that interconnects respective bottom electrodes of the PV cells.

The electrically conductive layer may be made of a metal such as copper, which is attached to the top of the body 27 by methods known to those skilled in the art, such as electroplating, adhesive bonding or mechanical pressing. In embodiments, the copper conductive layer may be embodied as a set of thermal couplers 15. The top electrodes of the PV cells can be interconnected via known processes, including welding, soldering and wire or ribbon bonding using gold or silver wires/ribbons, or other metal interconnects. The body 27 is typically fabricated out of a layered structure comprising layers of silicon and/or glass. The individual layers of the layered structure are joined together using established bonding processes, including fusion bonding, anodic bonding or eutectic bonding.

In embodiments, body 27 may be produced by additive manufacturing techniques using metals and alloys such as stainless steel, nickel, or titanium. The body 25 may be made from an engineering plastic, including but not limited to acrylonitrile butadiene styrene (ABS), polyoxymethylene plastic (POM) or polyphenylene sulfide (PPS). Bodies 27 and 25 may be joined together using established adhesive bonding processes known to those skilled in the art, for example but not limited to one-part adhesives, multi-component adhesives or contact adhesives.

According to another aspect, the invention can be embodied as a method for cooling a PV system. Aspects of such a method have already been noted earlier in reference to FIGS. 1-4 and 9. Basically, this method applies to a PV system comprising PV cells 10 arranged side-by-side to form an array 5 of PV cells 10, as depicted in FIG. 1. The method essentially involves cooling the PV cells 10 by removing heat from PV cells 10 of the array 5 with different heat removal rates. I.e., consistently with principles described so far, heat is removed with different heat removal rates from one cell 10 to the other.

In embodiments, the step of cooling the PV cells 10 is performed due to a cooling device 20 such as described earlier, i.e., a device that comprises one or more layers 21-23, extending opposite to the array 5 of PV cells 10 and in thermal communication therewith. The layers 21-23 are suitably structured so as for the system 1 to exhibit a thermal resistance that varies across the cells 10, i.e., in a plane (x, y) parallel to an average plane of the array 5, consistently with what precedes.

The system 1 may notably be a CPV system or a hybrid system. In one or more embodiments, the cooling is performed according to a predetermined illumination profile of the PV cells 10 of the array 5, e.g., a centric or homogenized profile. As illustrated in FIG. 7A, the cooling may be performed so as to confine a spread of output voltages of the cells 10 at the MPP, such that a maximal difference in the voltages at the maximum power point of all the PV cells 10 of the array 5 be less than 0.2 V, or even less than 0.1 V, as discussed earlier. Owing to the reduced spread, PV cells 10 can favorably be connected in parallel.

A liquid-based cooling system may be used, allowing to circulate a liquid via non-uniform patterns of orifices 31, 32 across layers 21-23 of the cooling device 20, to allow non-uniform heat exchanges via the orifices 31, 32 and, in turn, to remove heat at distinct PV cells 10 of the array 5 with different heat removal rates. As discussed earlier in reference to FIGS. 3-4, cooling the PV cells 10 may notably involve circulating a liquid via distinct, non-uniform patterns of orifices 31, 32 of two contiguous layers 21, 22, or more of the layer stack 21-23.

The above embodiments have been succinctly described in reference to the accompanying drawings and may accommodate a number of variants. Several combinations of the above features may be contemplated. In particular, variants described in reference to PV systems may be exploited in cooling methods, and conversely.

While the present invention has been described with reference to a limited number of embodiments, variants and the accompanying drawings, it will be understood by those skilled in the art that various changes may be made and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims. For example, the cooling device 20 may comprise various manifold layer designs and other dimensions/materials could be used.

What is claimed is:

1. A method for cooling a photovoltaic system, the method comprising:
    arranging photovoltaic cells side-by-side to form an array of the photovoltaic cells; and
    cooling the photovoltaic cells by removing heat from the photovoltaic cells of the array with different heat removal rates,
    wherein cooling the photovoltaic cells is performed in response to varying a thermal resistance across the array of photovoltaic cells so as to remove heat from the photovoltaic cells of the array with different heat removal rates, in operation,
    wherein cooling the photovoltaic cells is performed due to a cooling device comprising one or more layers, arranged opposite to the array of photovoltaic cells and in thermal communication therewith, wherein the one or more layers are structured such that the photovoltaic system has a thermal resistance that varies across the array of photovoltaic cells, and
    wherein cooling the photovoltaic cells comprises circulating a liquid via a non-uniform pattern of orifices of the one or more layers, to allow a non-uniform heat exchange via the orifices and, in turn, to remove heat at distinct photovoltaic cells of the array with different heat removal rates.

2. The method according to claim 1, wherein:
    cooling the photovoltaic cells is performed according to a predetermined illumination profile of the photovoltaic cells of the array.

3. The method according to claim 2, wherein:
    cooling the photovoltaic cells is performed so as to confine a spread of voltages of the cells at a maximum power point, such that a maximal difference in the voltages at the maximum power point of each of the photovoltaic cells of the array is less than 0.2 V.

4. The method according to claim 3, wherein:
    cooling the photovoltaic cells is performed such that the maximal difference is less than 0.1 V.

5. The method according to claim 4, wherein:
    at least some of the photovoltaic cells are electrically connected in parallel in the array.

6. The method according to claim 1, wherein:
    cooling the photovoltaic cells comprises circulating a liquid via distinct, non-uniform patterns of orifices of two contiguous layers of the one or more layers.

7. The method according to claim 1, wherein:
    the photovoltaic system is a concentrated photovoltaic system (1) configured to concentrate light onto an area of the array of photovoltaic cells, thereby giving rise to a non-uniform illumination profile of the photovoltaic cells; and
    cooling the photovoltaic cells is performed according to the non-uniform illumination profile.

* * * * *